US008952546B2

(12) United States Patent
Fujimura et al.

(10) Patent No.: US 8,952,546 B2
(45) Date of Patent: Feb. 10, 2015

(54) INTEGRATED CIRCUIT DESIGNED AND MANUFACTURED USING DIAGONAL MINIMUM-WIDTH PATTERNS

(71) Applicant: D2S, Inc., San Jose, CA (US)

(72) Inventors: Akira Fujimura, Saratoga, CA (US);
Larry Lam Chau, Fremont, CA (US);
Tam Dinh Thanh Nguyen, Fremont, CA (US)

(73) Assignee: D2S, Inc., San Jose, CA (US)

( * ) Notice: Subject to any disclaimer, the term of this patent is extended or adjusted under 35 U.S.C. 154(b) by 0 days.

(21) Appl. No.: 14/269,413

(22) Filed: May 5, 2014

(65) Prior Publication Data

US 2014/0245247 A1    Aug. 28, 2014

Related U.S. Application Data

(62) Division of application No. 12/779,031, filed on May 12, 2010, now Pat. No. 8,745,555.

(51) Int. Cl.
*H01L 29/72* (2006.01)
*G06F 17/50* (2006.01)
*H01L 27/02* (2006.01)
*H01L 27/11* (2006.01)

(52) U.S. Cl.
CPC ........ *G06F 17/5072* (2013.01); *G06F 17/5077* (2013.01); *H01L 27/0207* (2013.01); *H01L 27/11* (2013.01)
USPC ............. 257/774; 716/55; 716/121; 716/126; 716/129; 716/130

(58) Field of Classification Search
USPC ............. 257/744; 716/55, 121, 126, 129, 130
See application file for complete search history.

(56) References Cited

U.S. PATENT DOCUMENTS

| 5,783,462 | A | 7/1998 | Huang |
| 5,864,496 | A | 1/1999 | Mueller et al. |
| 6,526,555 | B1 | 2/2003 | Teig et al. |
| 6,858,935 | B1 | 2/2005 | Teig et al. |
| 7,332,252 | B2 | 2/2008 | Kang et al. |
| 7,480,887 | B1 * | 1/2009 | Hsu ............................. 716/129 |
| 7,745,078 | B2 | 6/2010 | Fujimura et al. |
| 7,754,401 | B2 | 7/2010 | Fujimura et al. |
| 7,772,575 | B2 | 8/2010 | Yoshida et al. |
| 8,039,176 | B2 | 10/2011 | Fujimura et al. |
| 2005/0229134 | A1 | 10/2005 | Hetzel et al. |
| 2005/0273746 | A1 | 12/2005 | Malhotra et al. |
| 2008/0118852 | A1 | 5/2008 | Mitsuhashi |
| 2010/0050146 | A1 * | 2/2010 | Frankle et al. .................. 716/12 |
| 2010/0055580 | A1 | 3/2010 | Fujimura et al. |
| 2010/0055587 | A1 | 3/2010 | Fujimura et al. |

OTHER PUBLICATIONS

International Search Report and Written Opinion dated Jan. 17, 2012 for PCT Application No. PCT/US2011/035082.

* cited by examiner

*Primary Examiner* — Edward Wojciechowicz
(74) *Attorney, Agent, or Firm* — The Mueller Law Office, P.C.

(57) ABSTRACT

An integrated circuit comprising a plurality of standard cell circuit elements is disclosed, wherein for at least one layer of the integrated circuit, a majority of minimum-width patterns are in a preferred diagonal orientation.

8 Claims, 5 Drawing Sheets

INTEGRATED CIRCUIT DESIGNED AND MANUFACTURED USING DIAGONAL MINIMUM-WIDTH PATTERNS

RELATED APPLICATIONS

This application is a divisional of U.S. patent application Ser. No. 12/779,031 filed on May 12, 2010 entitled "Method For Integrated Circuit Design And Manufacturing Using Diagonal Minimum Width Patterns," which is hereby incorporated by reference for all purposes.

BACKGROUND OF THE DISCLOSURE

The present disclosure is related to the design of integration circuits, and more particularly to the use of non-manhattan patterns in integrated circuit design.

In the production or manufacturing of semiconductor devices, such as integrated circuits, optical lithography may be used to fabricate the semiconductor devices. Optical lithography is a printing process in which a lithographic mask or photomask manufactured from a reticle is used to transfer patterns to a substrate such as a semiconductor or silicon wafer to create the integrated circuit (I.C.). Other substrates could include flat panel displays or even other reticles. Also, extreme ultraviolet (EUV) or X-ray lithography are considered types of optical lithography. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels, holograms, or magnetic recording heads.

In the production or manufacturing of semiconductor devices, such as integrated circuits, maskless direct write may also be used to fabricate the semiconductor devices. Maskless direct write is a printing process in which charged particle beam lithography is used to transfer patterns to a substrate such as a semiconductor or silicon wafer to create the integrated circuit. Other substrates could include flat panel displays, imprint masks for nano-imprinting, or even reticles. Desired patterns of a layer are written directly on the surface, which in this case is also the substrate. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical lithography while others may be written using maskless direct write to fabricate the same substrate. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels, holograms, or magnetic recording heads.

Two common types of charged particle beam lithography are variable shaped beam (VSB) and character projection (CP). These are both sub-categories of shaped beam charged particle beam lithography, in which a precise electron beam is shaped and steered so as to expose a resist-coated surface, such as the surface of a wafer or the surface of a reticle. In VSB, these shapes are simple shapes, usually limited to rectangles of certain minimum and maximum sizes and with sides which are parallel to the axes of a Cartesian coordinate plane (i.e. of "manhattan" orientation), and 45 degree right triangles (i.e. triangles with their three internal angles being 45 degrees, 45 degrees, and 90 degrees) of certain minimum and maximum sizes. At predetermined locations, doses of electrons are shot into the resist with these simple shapes. The total writing time for this type of system increases with the number of shots. In character projection (CP), there is a stencil in the system that has in it a variety of apertures or characters which may be rectilinear, arbitrary-angled linear, circular, nearly circular, annular, nearly annular, oval, nearly oval, partially circular, partially nearly circular, partially annular, partially nearly annular, partially nearly oval, or arbitrary curvilinear shapes, and which may be a connected set of complex shapes or a group of disjointed sets of a connected set of complex shapes. An electron beam can be shot through a character on the stencil to efficiently produce more complex patterns on the reticle. In theory, such a system can be faster than a VSB system because it can shoot more complex shapes with each time-consuming shot. Thus, an E-shaped pattern shot with a VSB system takes four shots, but the same E-shaped pattern can be shot with one shot with a character projection system. Note that VSB systems can be thought of as a special (simple) case of character projection, where the characters are just simple characters, usually rectangles or 45-45-90 degree triangles. It is also possible to partially expose a character. This can be done by, for instance, blocking part of the particle beam. For example, the E-shaped pattern described above can be partially exposed as an F-shaped pattern or an I-shaped pattern, where different parts of the beam are cut off by an aperture. This is the same mechanism as how various sized rectangles can be shot using VSB. In this disclosure, partial projection is used to mean both character projection and VSB projection.

As indicated, in optical lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns the CAD program may follow a set of predetermined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

One goal in integrated circuit fabrication by optical lithography is to reproduce on the substrate the original circuit design by use of the reticle. Integrated circuit fabricators are always attempting to use the semiconductor wafer real estate as efficiently as possible. Engineers keep shrinking the size of the circuits, either allowing an integrated circuit with the same number of circuit elements to be smaller and use less power, or allowing an integrated circuit of the same size to contain more circuit elements. As the size of an integrated circuit critical dimension is reduced and its circuit density increases, the critical dimension of the circuit pattern or physical design approaches the resolution limit of the optical exposure tool used in optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. OPC includes all resolution enhancement technologies performed with a reticle.

There are a number of technologies used for forming patterns on a reticle, including using optical lithography or charged particle beam lithography. The most commonly used system is the variable shaped beam (VSB), where, as described above, doses of electrons with simple shapes such as manhattan rectangles and 45-degree right triangles expose a resist-coated reticle surface. In conventional mask writing, the doses or shots of electrons are conventionally designed to avoid overlap wherever possible, so as to greatly simplify calculation of how the resist on the reticle will register the pattern.

Integrated circuits are physically designed with a plurality of layers, each of which contains a plurality of patterns. Many conventional integrated circuit design methodologies require that all patterns or shapes for many of the layers in a design, including both shapes which denote transistors and shapes which represent interconnect or wires, be of manhattan orientation, with respect to the integrated circuit boundary. Design rules for many current integrated circuit fabrication processes allow shapes to be designed that are much smaller in their minimum dimension than the wavelength of the light that will be used to transfer the design pattern from a mask the wafer. In some advanced processes the design rules dictate a preferred wiring direction or orientation on one or more layers. For example, a process may restrict shapes on a given layer to have their longest dimension be aligned with the x-axis of the Cartesian plane. Alternatively, shapes having the smallest minimum dimension or minimum width may be restricted to the preferred orientation, but shapes with a width larger than the minimum width may not be restricted.

The use of non-manhattan shapes to interconnect circuit elements in the art potentially allows for reduction in the area of an integrated circuit design, reduction in power consumption of the design, improved circuit performance of the design, improved yield of the design, or improved manufacturing tolerance of the design. The layers used for interconnecting circuit elements such as standard cells, however, are conventionally larger than the layers used in the design of individual circuit elements or standard cells, such layers including diffusion, polysilicon or poly, and metal-1, where metal-1 is the first fabricated layer of metal. In circuit element or standard cell design, the diffusion and poly layers are commonly used to define individual transistors. The metal-1 layer is commonly used for interconnecting transistors within a circuit element or standard cell, such as a digital logic gate. The metal-2 layer and above (metal-3, metal-4, etc.) are commonly used for interconnecting circuit elements such as standard cells. The prior art, which addresses non-manhattan shapes on the layers which interconnect circuit elements, is not easily transferable to the thinner cell design layers because of the greater difficulty of fabricating these smaller layers, the complexity introduced by forming transistors with non-manhattan orientations, and the need to address issues of preferred direction during the design of a cell library which may be used for a plurality of integrated circuit designs. Therefore, there remains a continuing need to reduce the area, power consumption, circuit performance, yield, and manufacturing tolerance of integrated circuit designs, in particular for the layers used in cell design.

SUMMARY OF THE DISCLOSURE

An integrated circuit comprising a plurality of standard cell circuit elements is disclosed, wherein for at least one layer of the integrated circuit, a majority of minimum-width patterns are in a preferred diagonal orientation.

DETAILED DESCRIPTION OF THE EMBODIMENTS

The present invention utilizes a preferred diagonal direction for patterns on at least one layer during the physical design of cells, such as standard cells, which are used in the layout of an integrated circuit. The present invention also includes methods for efficiently forming the diagonal patterns on a photomask for use in optical lithography, such as through the use of model-based fracturing using charged particle beam simulation, overlapping CP and/or VSB shots, and overlapping CP and/or VSB shots. The present invention also includes forming the preferred diagonal direction patterns on a substrate such as a silicon wafer using the photomask and an optical lithographic process with directional illumination which is optimized for the preferred diagonal direction. The invention improves the ability to reduce chip area, reduce power consumption, improve circuit performance, improve yield, or improve manufacturing tolerance or in any other way improve a desired metric for integrated circuit design.

When writing sub-wavelength patterns for the most advanced fabrication processes using optical lithography, for example in writing patterns for a 22 nm logic node process using 193 nm immersion optical lithography, the notion of a preferred direction becomes strong. It is easier to perform OPC on a set of patterns which have a strong sense of a preferred direction. Additionally, a set of patterns with a preferred direction can be transferred from a photomask to a wafer or other surface using a directional light source which is adjusted to transfer most precisely patterns in that preferred direction (a process that may be referred to as source mask optimization or SMO). Conventionally, the preferred directions are vertical or horizontal to the wafer and mask orientations, which are normally the same. Although the idea of rotating either the mask or the wafer during writing has been considered, no mask writing or wafer writing equipment exists today that can accurately rotate either the mask or the wafer for production use. Photomasks used for optical lithography, however, may have patterns in any preferred direction, including non-manhattan or diagonal directions. Some dynamic random access memory (DRAM) designs, for example, have diagonal lines as the pre-dominant direction, taking advantage of optical lithography's ability to write at any angle, so long as all critical dimension features of that mask are in that same direction. Conventionally, however, forming diagonal patterns on a reticle or mask requires many VSB shots, and is therefore very expensive. In DRAM manufacturing mask cost is not a significant factor in the economics of the business, due to the large wafer volumes produced from the same mask set. By contrast, for system-on-chip (SOC) designs that employ standard cells, the wafer volume is typically not as high, and therefore mask cost is a much more significant factor. Availability of model-based mask data preparation (MDP) techniques reduce significantly the mask cost when using an off-axis preferred direction, and thereby enables the present invention.

Figure 1:
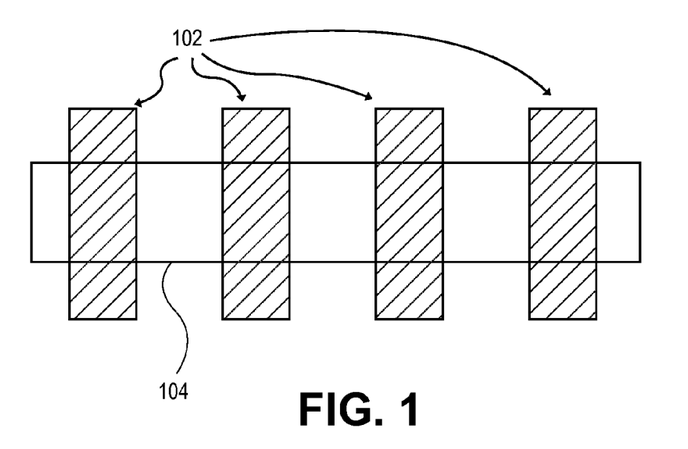
FIG. 1 illustrates an example of a conventional layout design for a group of transistors.

In many integrated circuit design processes, the smallest features, and therefore the greatest lithographic challenges, may occur in layers that are close to the silicon wafer, such as poly, contact, and metal-1, where metal-1 is the layer of metal closest to the wafer. The poly, contact, and metal-1 layers are normally used in the physical design of individual cells such as logic cells, as opposed to the interconnections among cells. To form the smallest possible features on layers such as poly, contact, and metal-1 using optical lithography, the photomask image may be projected onto the substrate using a directional illumination method. Examples of directional illumination methods include quasar, c-quad, dipole and source-mask optimized (SMO) illumination. Use of directional illumination can allow formation of patterns having a preferred angular orientation with a smaller minimum dimension or width than can be formed for patterns oriented at other angles. Conventionally, the directional illumination is optimized for patterns which have their longest dimension parallel to either the x-axis or the y-axis. Referring now to the drawings, wherein like numbers refer to like items, FIG. 1 illustrates an example of a conventional group of transistors formed by a plurality of poly lines or patterns 102, illustrated as crosshatched, and a single diffusion line or pattern 104. Both the poly lines 102 and diffusion line 104 have conventional manhattan orientation. The poly lines 102 have been restricted to a vertical orientation to allow use of a directional light source in the optical lithography process.

Figure 2:
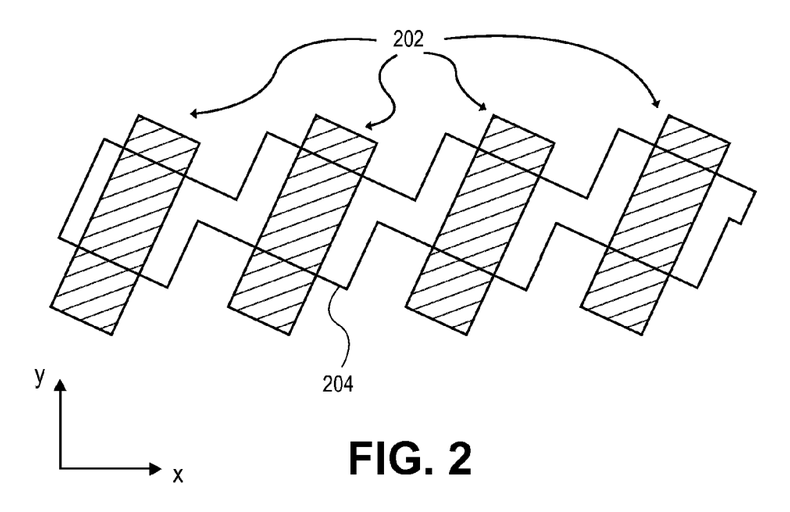
FIG. 2 illustrates an example of a non-manhattan layout design for a group of transistors, according to the current invention.

FIG. 2 illustrates an example of a different group of transistors, also formed by a plurality of poly lines 202 and a diffusion line 204, according to an embodiment of the current invention. As can be seen, the poly lines 202 are parallel, have a non-manhattan or diagonal orientation with respect to the Cartesian coordinate axis and also with respect to the integrated circuit boundary, which is not shown. Allowing diagonal patterns to be used in the physical design of cells such as logic cells or static random access memory (SRAM) blocks may beneficially allow the design of smaller cells than if all patterns are restricted to manhattan orientation. All of the poly lines 202 have the same orientation. Directional illumination can therefore be used to transfer the poly lines 202 from the photomask to a wafer surface, with the directional illumination being optimized for the diagonal orientation of poly lines 202. This allows the poly lines 202 to be designed with the same minimum line width as the poly patterns 102 in the example of FIG. 1 when patterns 102 are transferred using conventional directional illumination optimized for vertical patterns.

The advantages of using a preferred diagonal orientation for a layer may be maximized if the physical design of all cells in a cell library, and therefore all cells in a design, use the same preferred diagonal orientation, and where all minimum-width patterns for cells in the design therefore have the same preferred diagonal orientation. In one embodiment of the present invention, in a system-on-chip (SOC) design using a library of standard cells representing a library of digital logic cells and static random access memory (SRAM) blocks, the entire standard cell library (i.e. all the cells in the library) may be designed using a preferred diagonal orientation for a given layer. In one embodiment, the preferred orientation for all library cells will be determined by the diagonal orientation of patterns in the SRAM, since the area required for one or more SRAM blocks may be a major contributor to total chip area. In other embodiments, different layers may have diagonal orientations with different preferred angles of orientation. For advanced processes, such as a 22 nm logic node process, patterns which are not in the preferred orientation may have a larger required minimum width than patterns which are in the preferred orientation. When the minimum-width patterns for all cells in an integrated circuit design have a single diagonal preferred orientation, a single photomask may be used to transfer the full pattern to a substrate such as wafer.

In another embodiment, a majority of minimum-width patterns for the cells in a cell library may be oriented in a preferred diagonal direction, but a number of patterns having the same minimum width may be oriented in a different direction, for example parallel to the x-axis. If all of these patterns are transferred to a single photomask, and if directional illumination optimized for the preferred diagonal direction is used during optical lithography, the minimum-width patterns in the non-preferred direction may not be properly formed on the substrate or wafer. Proper transfer of both minimum geometry preferred-orientation diagonal patterns and, for example, minimum geometry x-axis aligned patterns may be achieved by exposing the preferred diagonal orientation patterns onto a first reticle, and the x-axis aligned patterns onto a second reticle. The masks made from these two reticles may be used in sequence to transfer the entire layer pattern onto a wafer, allowing the use of optimized directional illumination for diagonal patterns on the first mask, and optimized directional illumination for the x-axis aligned patterns on the second mask.

Referring again to FIG. 1, the conventional poly shapes 102 may be formed on a resist-covered reticle using conventional VSB shots. Each poly shape 102 may be formed with one VSB shot. The process of determining a set of charged particle beam shots which can form a pattern is called fracturing. In conventional fracturing for VSB pattern writing, the fracturing process determines a set of VSB shots such that:

Each shot has the same dosage, before a subsequent proximity effect correction (PEC) step, The shots outlines do not overlap each other, The shot outlines completely "cover" the desired pattern, meaning the union of shot outlines is the same as the desired pattern.

The goal of the above restrictions is providing the same dosage to all parts of the desired pattern on the resist-coated surface when the pattern is written. In a process of proximity effect correction (PEC), which normally follows fracturing, shot dosages are modified based on a variety of physical effects, some relatively short-range such as forward scattering, and some relatively long-range such as backward scattering, so that the resist-coated surface receives the same total dosage, or close to it, for all parts of the desired pattern. This conventional technique allows the pattern formed on the resist-covered reticle to be predicted without using detailed simulation techniques. Conventionally, all cells in a library of cells are designed using Manhattan patterns exclusively on, for example, diffusion, poly, contact and metal-1 layers.

Referring again to FIG. 2, creation of the poly mask patterns 202 of FIG. 2 using conventional non-overlapping VSB shots will require many more shots than the patterns of FIG. 1 because of the diagonal orientation of patterns 202. Conventionally, a large number of rectangular shots which are narrow in either the "x" or "y" dimension will be used. This large number of shots is impractically time-consuming and expensive if used for a significant fraction of a layer's patterns. Prior art techniques for forming the poly patterns 202 on a mask using fewer shots than if the reticle and the VSB apertures are aligned in a manhattan orientation are summarized below:

A VSB particle beam exposure system may be used in which the first and second apertures are rotated to match the angle of the poly lines 202. This has the disadvantage of needing to adjust both machine apertures for exposure of the layer. Additionally, with this technique manhattan shapes of any dimension will require many shots due to the diagonally-oriented VSB apertures.

A CP particle beam writer may be used with a CP stencil containing a character specifically designed to form a short piece of the poly with the desired angle and width. This has the disadvantage of requiring valuable space for the designated character on the CP stencil, which can hold only a limited number of characters.

A conventional VSB machine can be used, where the reticle being written is rotated within the machine. This has the disadvantage, however, that if the particle beam writer has a square or rectangular maximum field size (as opposed to a circular maximum field size), then the effective maximum field size for the rotated reticle is smaller than the maximum field size for a reticle in conventional manhattan orientation. Additionally, manhattan shapes of any dimension become expensive to write, if the entire reticle is written while rotated. Also, equipment which can precisely position the reticle in a non-manhattan orientation is not commercially available.

All of the above techniques are variations on conventional VSB writing, in that they allow use of non-overlapping shots, a constant shot dosage before proximity effect correction (PEC), and the union of shots matches the designed pattern. Additionally, the limitations of the above techniques discourage the use of non-manhattan patterns, such as the use of a preferred diagonal orientation for patterns, as set forth above.

In contrast to the conventional fracturing technique described above, model-based fracturing or model-based mask data preparation (MDP) can be used to determine a set of charged particle beam shots which can form non-manhattan patterns on a reticle, such as a set of patterns in a preferred diagonal direction. With model-based fracturing, charged particle beam simulation is used to calculate the pattern which an initially-determined set of shots can produce on a resist-coated surface. If the simulated pattern is not within a predetermined tolerance of a desired pattern, the set of shots can be modified. The modification may, for example, involve adding shots, deleting shots, and changing the location or dosage of existing shots in the set of shots. Shots in the set of shots may overlap. The dosages of the shots may vary before PEC, if the charged particle beam writer allows assigned shot dosages. Either VSB shots or CP character shots can be used. In model-based fracturing, the union of the set of shots need not match the desired pattern. The process can start from an initial set of shots and iterate to a solution of acceptable accuracy, or can use a deterministic "correct-by-construction" method.

Figure 3:
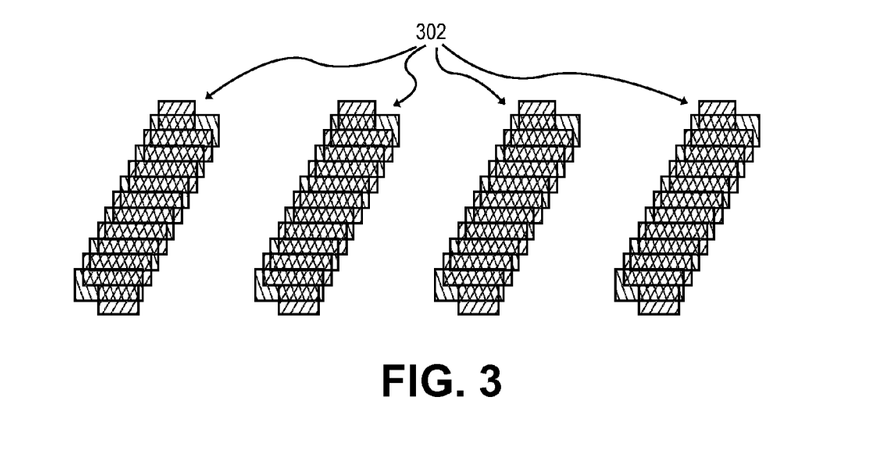
FIG. 3 illustrates an example of a set of charged particle beam shots which may form the diffusion pattern of FIG. 2.

FIG. 3 illustrates the use of model-based fracturing in an exemplary embodiment of the present invention, showing a non-conventional set of VSB shots that can be used to form each of four diagonal patterns 302. Each manhattan-oriented rectangle in FIG. 3 represents a shot outline—a pattern that may be produced on a resist-coated surface by a single shot in the absence of other nearby shots. As can be seen, many shot outlines in FIG. 3 overlap each other. The number of VSB shots required to form a diagonal pattern will, in general, depend on the required precision of the pattern to be formed. The pattern that can be formed on a resist-coated surface such as a reticle by the shots shown in FIG. 3 can be determined through the use of particle beam simulation. The particle beam simulation can be used to model a variety of physical effects, including forward scattering, resist diffusion, Coulomb effect and/or etching.

Figure 4:
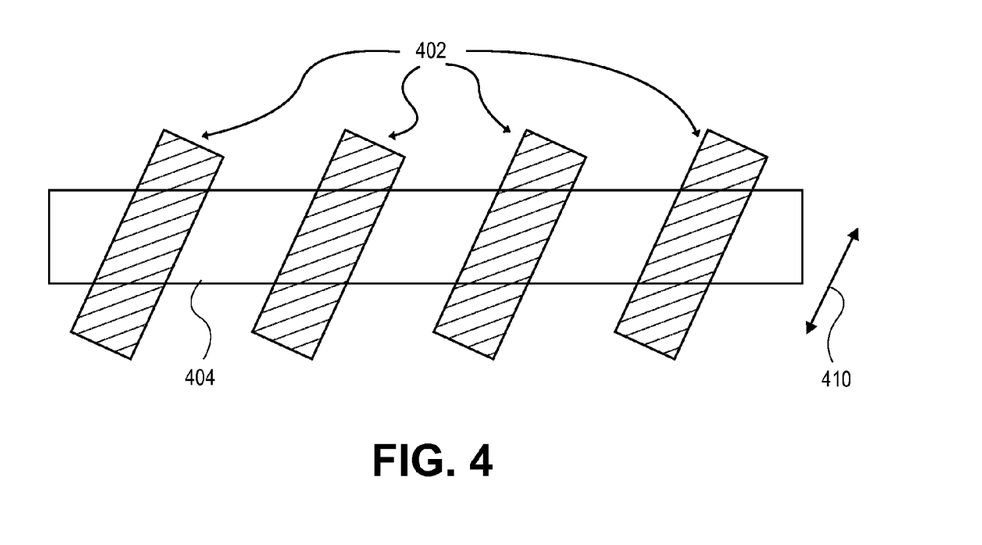
FIG. 4 illustrates an example of an alternative non-manhattan layout design for a group of transistors, according to the current invention.

FIG. 4 illustrates another embodiment of the current invention, an exemplary example of group of transistors, formed by a plurality of poly lines 402 and a diffusion line 404. Like the example of FIG. 2, the poly lines 402 have a diagonal orientation with respect to the Cartesian coordinate axes. The orientation of the poly lines 402 is parallel to a preferred orientation 410. In FIG. 4, however, the diffusion line 404 is horizontal. The transistor gate areas, which in many I.C. fabrication processes are formed where the designed poly and diffusion patterns overlap, are therefore non-rectangular parallelograms.

Figure 5A:
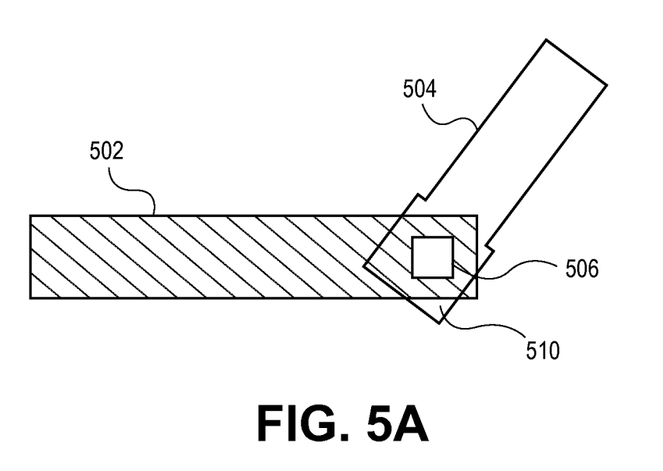
FIG. 5A illustrates an example of electrically connecting a non-manhattan shape on a first layer to a manhattan shape on a second layer, using a conventional square contact or via.

Use of diagonal patterns can cause difficulties in connecting these diagonal patterns to manhattan patterns on a different layer of the integrated circuit physical design. Conventionally, square contacts or vias are used to interconnect patterns on other layers, as demonstrated in FIG. 5A. FIG. 5A illustrates an example of a diagonal pattern 504 on a first layer, the pattern 504 electrically connecting to a manhattan pattern 502 on a second layer. The connection is accomplished using a contact or via 506, which is designed on a third layer. The contact or via 506 is a conventional square pattern in a manhattan orientation. Both patterns 502 and 504 must enclose the contact or via 506 by a predetermined minimum distance. As can be seen, the contact or via 506 is oriented so as to be aligned with the manhattan pattern 502, and is consequently not oriented to align with diagonal pattern 504. Because the contact or via 506 is not oriented so as to be aligned with diagonal pattern 504, the width of pattern 504 must be larger in the vicinity 510 of contact or via 506 than if pattern 504 was manhattan. The additional width of pattern 504 in the vicinity 510 of contact or via 506 is required to maintain a minimum required enclosure distance between pattern 504 and contact or via 506. It should be noted that if contact 506 were aligned with pattern 504, then contact 506 would not be aligned with pattern 502, and the width of pattern 502 would therefore need to be larger in the vicinity of contact 506 than is shown in FIG. 1. There is no orientation of contact 506 that would obviate the need for extra proximate width for either or both pattern 504 and pattern 506.

Figure 5B:
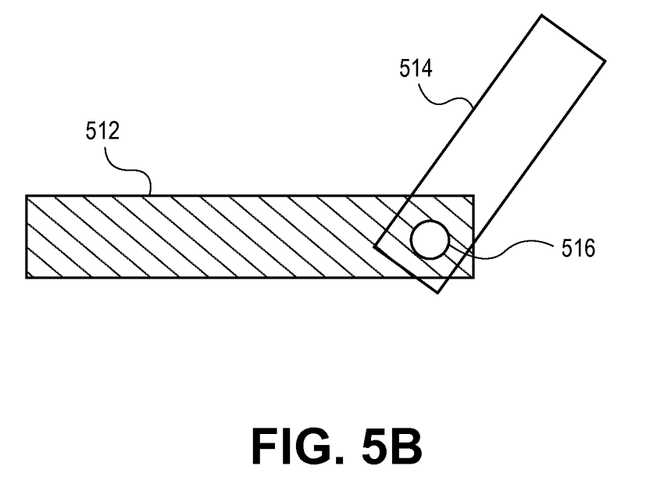
FIG. 5B illustrates an example of electrically connecting a non-manhattan shape on a first layer to a manhattan shape on a second layer, using an exemplary circular contact or via of the present invention.
Figure 6:
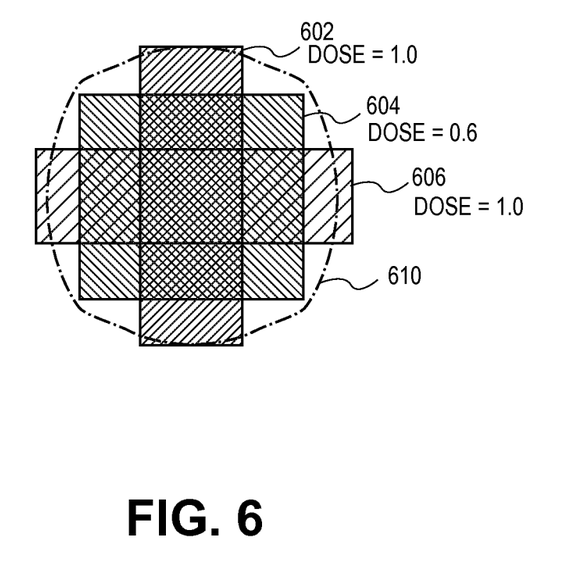
FIG. 6 illustrates an example of a set of overlapping, variable-dosage VSB shots that can form a nearly circular pattern on a resist-coated surface.

In contrast to FIG. 5A, FIG. 5B illustrates an exemplary example of a diagonal pattern 514 on a first layer, the pattern 514 electrically connecting to a manhattan pattern 512 on a second layer, according to an embodiment of the current invention. A circular contact or via 516, designed on a third layer, is used. Use of the circular contact or via 516 beneficially obviates the need to increase the width of pattern 514 in the vicinity of contact or via 516, because the enclosure distance for a pattern surrounding a circular contact or via is the same regardless of the surrounding pattern's orientation. The use of circular or nearly-circular contacts or vias is therefore relatively more space-efficient for connecting two patterns which have relative orientations which are not at a zero or 90 degree angle with respect to each other, compared to the use of square vias such as is illustrated in FIG. 5A. In the examples of FIGS. 5A&B, the narrower pattern 514 in FIG. 5B compared to pattern 504 in FIG. 5A allows a closer "packing" of patterns adjacent to pattern 514 and on the same layer, compared to patterns adjacent to pattern 504. Circular or nearly-circular patterns are difficult to form on a reticle using conventional non-overlapping VSB shots, however, requiring a large number of small shots. Using one embodiment of the present invention, circular contacts or vias may be formed on a reticle for the contact or via layer using a single shot of a circular CP character. In another embodiment of the present invention, a small number of overlapping VSB shots may be used to form a nearly-circular pattern. FIG. 6 illustrates an example of a nearly-circular pattern 610 calculated from a set of three overlapping VSB shots comprising shot 602 with a relative dosage of 1.0, shot 604 with a relative dosage of 0.6, and shot 606 with a relative dosage of 1.0. Particle beam simulation can be used to calculate the pattern 610. Note that the calculated pattern 610 is different than the union of the shot 602, shot 604 and shot 606. In other embodiments, octagonal contacts or vias may be used, providing a benefit similar to the use of circular contacts.

Figure 7:
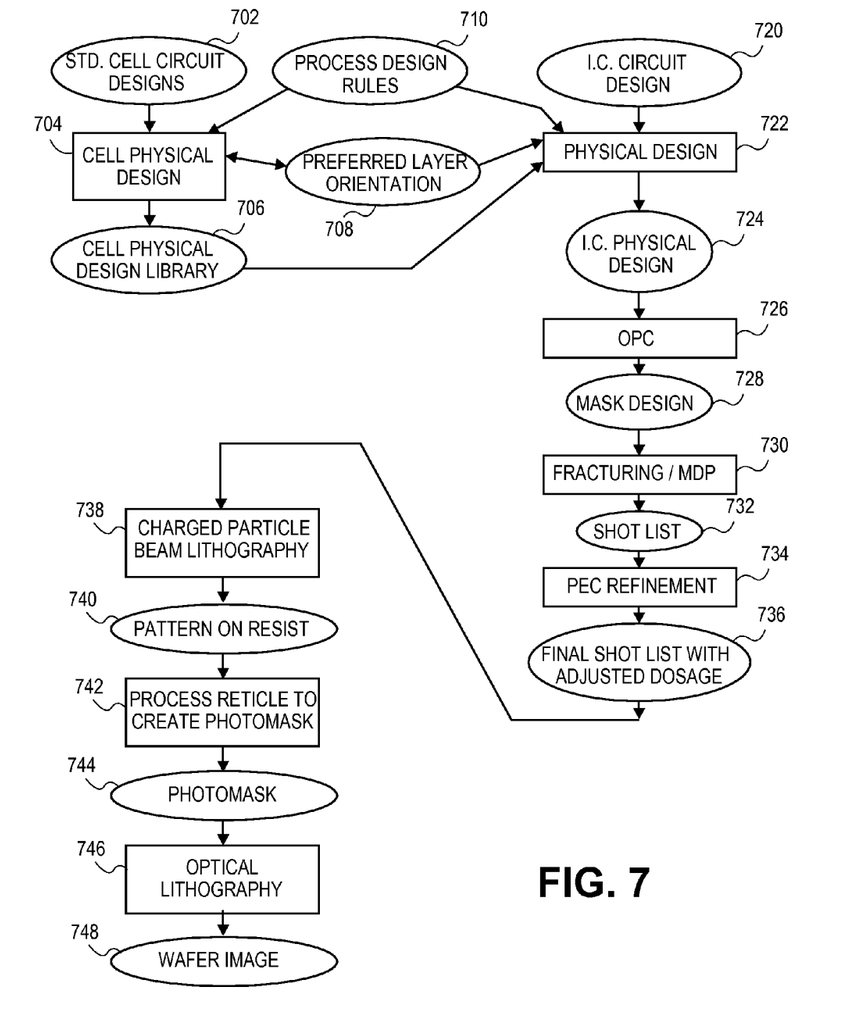
FIG. 7 illustrates an exemplary conceptual flow diagram of the present invention, for manufacturing an integrated circuit.

FIG. 7 is an exemplary conceptual flow diagram of a method for manufacturing an integrated circuit according to the current disclosure. The inputs to the process are circuit designs for a set of standard cells 702, a circuit design for the integrated circuit 720, and a set of process design rules 710. The set of standard cell circuit designs 702 may include designs for logic functions such as NAND gates, NOR gates and various flip-flops, and may also include, for example, static random access memory (SRAM) designs. The process design rules may, for example, specify a smaller minimum pattern width in a preferred orientation than in non-preferred orientations. In step 704 a physical design for each of the standard cells is created. In one embodiment of the present invention, preferred layer orientations are established during cell physical design 704. In other embodiments, the preferred layer orientations 708 may be determined before cell physical design begins, in which case the preferred layer orientations information 708 is an input to cell physical design 704. A preferred diagonal orientation may be determined for a layer, the diagonal orientation being with respect to other layers, and with respect to an eventual integrated circuit physical design boundary. If a diagonal preferred orientation is determined, then this preferred orientation may be used for all the cells in the cell library. An output of the physical design process 704 is the physical design for each of the standard cells, where each of the physical designs is stored in a cell physical design library 706. The preferred orientation information 708 for each layer may also be an output of the physical design process 704, if the preferred orientation was determined during cell physical design 704.

In the FIG. 7 conceptual flow diagram, the I.C. circuit design 720, the process design rules 710, the preferred layer orientations 708, and the cell physical design library 706 are all inputs to physical design process 722, which creates an I.C. physical design 724, the I.C. physical design 724 being a set of patterns on each of a plurality of layers. The I.C. physical design 724 may include a contact and/or via layer which electrically connects a pattern in the preferred diagonal direction to a pattern on a different layer using a circular or octagonal pattern on the contact or via layer. Optical proximity correction (OPC) 726 may be performed on the I.C. physical design 724 to produce a mask design 728. In a fracturing or mask data preparation (MDP) process 730, a set of charged particle beam shots or shot list 732 is determined which can form the patterns of the mask design 728 on a resist-coated surface such as a reticle. In one embodiment, each shot in the shot list 732 may comprise a dosage. In another embodiment, the shots in the shot list 732 may have unassigned individual shot dosages. Proximity effect correction 734 may then be performed on the shot list 732 to create a final shot list with adjusted dosages 736. The final shot list 736 is used by a charged particle beam writer to expose a resist-coated reticle in step 738 to create a pattern on a resist-coated reticle 740. The reticle containing the resist pattern 740 is processed in step 742 to create a photomask 744. The photomask 744 is used in an optical lithography process 746 to transfer the mask pattern to a resist-coated surface of a wafer, to create a wafer image 748.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present method for designing a cell library, designing and manufacturing an integrated circuit, and to the integrated circuit design itself, may be practiced by those of ordinary skill in the art, without departing from the spirit and scope of the present subject matter, which is more particularly set forth in the appended claims. Furthermore, those of ordinary skill in the art will appreciate that the foregoing description is by way of example only, and is not intended to be limiting. Thus, it is intended that the present subject matter covers such modifications and variations as come within the scope of the appended claims and their equivalents.

What is claimed is:

1. An integrated circuit comprising a physical design of a plurality of standard cell circuit elements, the physical design comprising:
   a plurality of manhattan layers, wherein a majority of patterns on each manhattan layer of the standard cell physical design are manhattan patterns; and
   a designated layer comprising a plurality of minimum-width patterns, wherein a majority of the minimum-width patterns are diagonal patterns in a preferred diagonal direction with respect to the manhattan patterns, and wherein the designated layer is for purposes other than interconnections between different standard cells.

2. The integrated circuit of claim 1, wherein one of the plurality of standard cell circuit elements comprises a static random access memory (SRAM).

3. The integrated circuit of claim 1, wherein the designated layer is selected from the group consisting of diffusion, poly and metal-1.

4. The integrated circuit of claim 1, further comprising:
a first layer in the plurality of manhattan layers; and
a connecting layer comprising a plurality of contact or via patterns, wherein a contact or via pattern in the plurality of contact or via patterns electrically connects a diagonal pattern on the designated layer with a manhattan pattern on the first layer, and wherein the contact or via pattern is circular or nearly-circular.

5. The integrated circuit of claim 4 wherein the contact or via pattern is octagonal.

6. The integrated circuit of claim 1 wherein the designated layer is poly, and wherein patterns in the plurality of minimum-width patterns form transistors.

7. The integrated circuit of claim 1 wherein the minimum pattern width of diagonal patterns on the designated layer is less than the minimum pattern width of manhattan patterns on the designated layer.

8. The integrated circuit of claim 1 wherein one of the plurality of standard cell circuit elements comprises a logic circuit element.

* * * * *